(12) United States Patent
Komenko et al.

(10) Patent No.: US 11,239,375 B2
(45) Date of Patent: Feb. 1, 2022

(54) METHOD FOR MANUFACTURING A PRESSURE SENSITIVE FIELD EFFECT TRANSISTOR INCLUDING A MEMBRANE STRUCTURE

(71) Applicant: Infineon Technologies AG, Neubiberg (DE)

(72) Inventors: Vladislav Komenko, Dresden (DE); Heiko Froehlich, Radebeul (DE); Thoralf Kautzsch, Dresden (DE); Andrey Kravchenko, Dresden (DE); Bernhard Winkler, Regensburg (DE)

(73) Assignee: INFINEON TECHNOLOGIES AG, Neubiberg (DE)

( * ) Notice: Subject to any disclaimer, the term of this patent is extended or adjusted under 35 U.S.C. 154(b) by 40 days.

(21) Appl. No.: 16/585,367

(22) Filed: Sep. 27, 2019

(65) Prior Publication Data
US 2020/0105945 A1   Apr. 2, 2020

(30) Foreign Application Priority Data
Oct. 2, 2018 (DE) .................................. 18198188.7

(51) Int. Cl.
*H01L 29/84* (2006.01)
*H01L 21/02* (2006.01)
(Continued)

(52) U.S. Cl.
CPC ........ *H01L 29/84* (2013.01); *H01L 21/02532* (2013.01); *H01L 21/02592* (2013.01);
(Continued)

(58) Field of Classification Search
CPC ........... H01L 2924/13072; H01L 41/00–0536; H01L 41/08–1138; H01L 27/20;
(Continued)

(56) References Cited

U.S. PATENT DOCUMENTS

| 8,999,786 B1* | 4/2015 | Wu | H01L 21/823425 |
| | | | 438/261 |
| 2008/0233738 A1* | 9/2008 | Beyer | H01L 21/76816 |
| | | | 438/643 |

OTHER PUBLICATIONS

Berney, H., "Determination of the effect of processing steps on the CMOS compatiblity of a surface micromachined pressure sensor", Institute of Physics Publishing, Journal of Micromechanics and Microengineering, vol. 11, www.iop.org/journals/jm, Jan. 2001, pp. 402-408.

(Continued)

*Primary Examiner* — Laura M Menz
*Assistant Examiner* — Candice Chan
(74) *Attorney, Agent, or Firm* — Slater Matsil, LLP

(57) ABSTRACT

A method for manufacturing a pressure sensitive transistor includes forming a channel region between first and second contact regions in a semiconductor substrate, forming a first isolation layer on a surface of the semiconductor substrate, forming a sacrificial structure on the first isolation layer and above the channel region, forming a semiconductor layer on the sacrificial structure and on the first isolation layer, wherein the semiconductor layer covers the sacrificial structure, removing the sacrificial structure for providing a cavity between the substrate and the semiconductor layer, wherein the semiconductor layer forms a membrane structure and forms a control electrode of the pressure sensitive transistor, forming a second isolation layer on the membrane structure and on the exposed portion of the surface of the semiconductor substrate, and forming contacting structures for the first contact region, the second contact region and the membrane structure of the pressure sensitive transistor.

21 Claims, 12 Drawing Sheets

(51) Int. Cl.
| | |
|---|---|
| *H01L 21/265* | (2006.01) |
| *H01L 21/285* | (2006.01) |
| *H01L 21/3105* | (2006.01) |
| *H01L 21/311* | (2006.01) |
| *H01L 21/324* | (2006.01) |
| *H01L 21/762* | (2006.01) |
| *H01L 29/06* | (2006.01) |

(52) U.S. Cl.
CPC ........... *H01L 21/02667* (2013.01); *H01L 21/26513* (2013.01); *H01L 21/28568* (2013.01); *H01L 21/31053* (2013.01); *H01L 21/31111* (2013.01); *H01L 21/324* (2013.01); *H01L 21/762* (2013.01); *H01L 29/0653* (2013.01); *H01L 2924/13072* (2013.01)

(58) Field of Classification Search
CPC ............ H01L 29/84; H01L 29/0653; H01L 29/0692; H01L 21/02532; H01L 21/02667; H01L 21/26513; H01L 21/28568; H01L 21/31053; H01L 21/31111; H01L 21/324; H01L 21/762; B81C 1/00158; B01D 67/0039; B81B 2203/0127

See application file for complete search history.

(56) References Cited

OTHER PUBLICATIONS

Hynes, E., et al., "Development and characterisation of a surface micromachined FET pressure sensor on a CMOS process", Elsevier, Sensors and Actuators A Physical, vol. 76, www.elsevier.nl/locate/sna, Feb. 13, 1999, pp. 283-292.

Kang, J.W., et al., "Surface Micromachined Multi-Layer Moving Gate Field Effect Transistor (MOGFET) Pressure Switch with Integrated Vacuum Sealed Cavity", IEEE International Conference on Micro Electro Mechanical Systems, (MEMS), Honeywell, Inc., Feb. 1999, pp. 499-504.

* cited by examiner

100

Forming 110 a channel region 22 between a first contact region 18 and a second contact region 20 in a semiconductor substrate 20 ⟵ 110

Forming 120 a first isolation layer 24 on a main surface 12-A of the semiconductor substrate 12 ⟵ 120

Forming 130 a sacrificial structure 26 on the first isolation layer 24 and above the channel region 22 ⟵ 130

Forming 140 a semiconductor layer 30 on the sacrificial structure and on the first isolation layer 24, wherein the semiconductor layer 30 covers the sacrificial structure 26 ⟵ 140

Removing 150 the sacrificial structure 26 for providing a cavity 34 between the substrate 12 and the semiconductor layer 12 wherein the semiconductor layer 30 forms a membrane structure having a displaceable center region 32 and forms a control electrode of the pressure sensitive transistor 10 ⟵ 150

Forming 160 a second isolation layer 40 on the membrane structure 30 ⟵ 160

Forming 170 contacting structures 44-1, 50-1, 44-2, 50-2, 44-3, 50-3 for the first contact region 18, the second contact region 20 and the membrane structure 30 of the pressure sensitive transistor 10 ⟵ 170

Fig. 1

METHOD FOR MANUFACTURING A PRESSURE SENSITIVE FIELD EFFECT TRANSISTOR INCLUDING A MEMBRANE STRUCTURE

This application claims the benefit of European Application No. 18198188.7, filed on Oct. 2, 2018, which application is hereby incorporated herein by reference.

TECHNICAL FIELD

Embodiments relate to a method or process for manufacturing a pressure sensitive transistor and in particular a pressure sensitive field effect transistor.

BACKGROUND

The detection of environmental parameters in the ambient atmosphere is becoming increasingly important in the implementation of appropriate sensors within mobile devices, but also in the application in home automation, such as smart home and, for example, in the automotive sector. However, with the ever more extensive use of sensors, there is also a particular need to be able to produce such sensors as inexpensively as possible and thus cost-effectively, but nevertheless the resulting reliability and accuracy of the sensors should be maintained or even increased.

The integration of pressures sensors using MEMS technology (MEMS=micro electrical mechanical system) allows a miniaturization of the pressure sensor area up to a half square millimeter. The sensing concept is based on generating a capacitor wherein a substrate (=a wafer or carrier) forms a first electrode and a deformable membrane forms a second electrode. An evacuated cavity between the substrate and the membrane serves as dielectric. During a pressure change in the sensor environment, the membrane is deformed, wherein such as deformation changes the distance between the electrodes. This results in a change of the capacitance that can be detected as an electric signal.

Currently used manufacturing processes are suitable to produce capacitive pressure sensors as passive devices, whose mode of operation is based on the above-described capacitive readout concept. The sensitivity of the capacitive pressure sensors depends, among others, on the active area of the capacitor, namely the size of the membrane. This sensor concept defines certain limits for the miniaturization of the capacitive sensor device.

Generally, there is a need in the art for an approach to implement improved pressure sensor devices having reduced area requirements and providing an adequate sensitivity to pressure changes in the environment.

Such a need can be solved by the method of manufacturing a pressure sensitive transistor according to independent claim 1 and a pressure sensitive transistor according to independent claim 17. Further specific implementations of the manufacturing method are defined in the sub-claims.

SUMMARY

According to an embodiment, a method for manufacturing a pressure sensitive transistor 10 comprises the steps of: forming no a channel region 22 between a first contact region 18 and a second contact region 20 in a semiconductor substrate 20, forming 120 a first isolation layer 24 on a main surface 12-A of the semiconductor substrate 12, forming 130 a sacrificial structure 26 on the first isolation layer 24 and above the channel region 22, forming 140 a semiconductor layer 30 on the sacrificial structure and on the first isolation layer 24, wherein the semiconductor layer 30 covers the sacrificial structure 26, removing 150 the sacrificial structure 26 for providing a cavity 34 between the substrate 12 and the semiconductor layer 30 wherein the semiconductor layer 30 forms a membrane structure having a displaceable center region 30-1 and forms a control electrode of the pressure sensitive transistor 10, forming 160 a second isolation layer 40 on the membrane structure 30 and on the exposed portion of the main surface of the semiconductor substrate, and forming 170 contacting structures 44-1, 50-1, 44-2, 50-2, 44-3, 50-3 for the first contact region 18, the second contact region 20 and the membrane structure 30 of the pressure sensitive transistor 10.

According to an embodiment, a pressure sensitive transistor 10 comprises a semiconductor substrate 12 having a channel region 22 between a first contact region 18 and a second contact region 20, the channel region 22 comprises a first doping type with a first doping concentration, wherein the first and second contact areas 18, 20 comprise a second doping type with a second doping concentration which is higher than the first doping concentration, a first isolation layer 24, which forms a control electrode dielectric, is arranged on the semiconductor substrate 12 and covers the channel region 22 and at least partially covers the first and second contact regions 18, 20, a membrane structure 30, which is arranged on the control electrode dielectric 24 and provides a cavity 34 with the opposing semiconductor substrate 12, wherein the membrane structure 30 forms a control electrode of the pressure sensitive transistor 10 and has a center region 30-1 which is displaceable in response to a changed pressure difference ΔP between the environment and the inner volume of the sealed cavity 34, a second isolation layer 40, which is at least laterally arranged to the membrane structure 30 for hermetically sealing the cavity 34 between the membrane structure 30 and the semiconductor substrate 12, and contact pads 50-1, 50-2, 50-3, which are connected to the first contact region 18, the second contact region 20, and the membrane structure 30, respectively.

BRIEF DESCRIPTION OF THE DRAWINGS

Embodiments of the present manufacturing method and the resulting pressure sensitive transistor are described herein making reference to the appended drawings and figures.

FIG. 1 shows an exemplary process flow (flowchart) of the method of manufacturing a pressure sensitive transistor according to an embodiment;

DETAILED DESCRIPTION OF ILLUSTRATIVE EMBODIMENTS

Figure 2A:
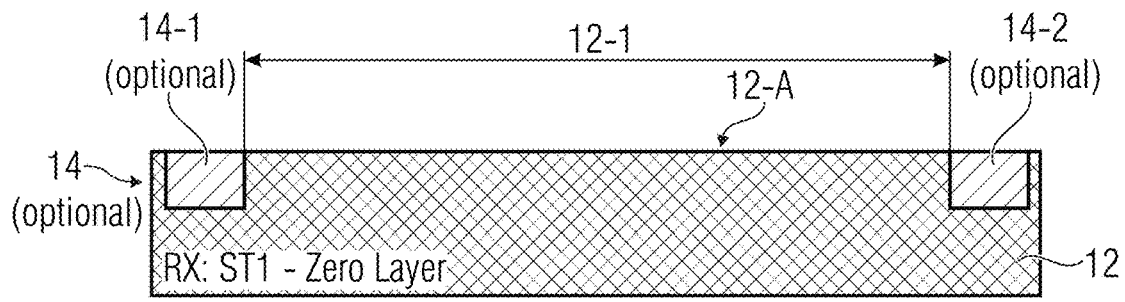
FIGS. 2A-2L show schematic cross-sectional views (schematic snapshots) of a semiconductor substrate and the manufacturing sensor elements at different stages of the method for manufacturing a pressure sensitive transistor according to an embodiment.

Before discussing the present embodiments in further detail using the drawings, it is pointed out that in the figures and the specification identical elements and elements having the same functionality and/or the same technical or physical effect are usually provided with the same reference numbers or are identified with the same name, so that the description of these elements and of the functionality thereof as illustrated in the different embodiments are mutually exchangeable or may be applied to one another in the different embodiments.

In the following description, embodiments are discussed in detail, however, it should be appreciated that the embodiments provide many applicable concepts that can be embodied in a wide variety of semiconductor devices. The specific embodiments discussed are merely illustrative of specific ways to make and use the present concept, and do not limit the scope of the embodiments. In the following description of embodiments, the same or similar elements having the same function have associated therewith the same reference signs or the same name, and a description of these elements will not be repeated for every embodiment. Moreover, features of the different embodiments described hereinafter may be combined with each other, unless specifically noted otherwise.

It is understood that when an element is referred to as being "connected" or "coupled" to another element, it may be directly connected or coupled to the other element, or intermediate elements may be present. Conversely, when an element is referred to as being "directly" connected to another element, "connected" or "coupled," there are no intermediate elements. Other terms used to describe the relationship between elements should be construed in a similar fashion (e.g., "between" versus "directly between", "adjacent" versus "directly adjacent", and "on" versus "directly on", etc.).

FIG. 1 shows an exemplary process flow or flowchart of a method 100 for manufacturing a pressure sensitive transistor 10.

The method 100 comprises a step 110 of forming a channel region 22 between a first contact region 18 and a second contact region 20 in a semiconductor substrate 12. In step 120, a first isolation layer 24 is formed on a main surface 12-A of the semiconductor substrate 12. In step 130, a sacrificial structure 26 is formed on the first isolation layer 24 and above the channel region 22. In step 140, a semiconductor layer 30 is formed on the sacrificial structure 26 and on the first isolation layer 24, wherein the semiconductor layer 30 covers the sacrificial structure 26. In step 150, the sacrificial structure 26 is removed for providing a cavity 34 between the substrate 12 and the semiconductor layer 30, wherein the semiconductor layer 30 forms a membrane structure 30 having a displaceable center region 30-1 and forms a control electrode (gate electrode) of the pressure sensitive transistor 10. In step 160, a second isolation layer 40 is formed on the membrane structure 30 and, laterally to the membrane structure, on the semiconductor substrate 12, e.g. on an exposed portion of the first isolation layer 24 on the main surface 12-A of the semiconductor substrate 12 and/or on an exposed portion of the main surface 12-A of the semiconductor substrate 12. In step 170, contacting structures 44-1, 50-1, 44-2, 50-2, 44-3, 50-3 for the first contact region 18, the second contact region 20 and the membrane structure 30 of the pressure sensitive transistor 10 are formed.

Thus, embodiments describe a process for producing and manufacturing a pressure sensitive field effect transistor 10 representing an alternative for capacitive pressure sensors. Here, a cavity 34 is generated below the gate electrode 30 in form of a membrane structure 30, which is subsequently evacuated by means of a sacrificial layer technology. Similar to the capacitive pressure sensor, a pressure change in the ambient atmosphere causes a deflection of the membrane structure 30 forming the gate electrode of the transistor. This results in a change of the capacitance of the gate capacitor, which influences or determines the channel resistance of the transistor 10.

Thus, embodiments relate to the process development for an integration of a pressure sensitive field effect transistor 10, wherein, based on the respective manufacturing steps, the channel region 22 is defined below the pressure sensor membrane 30. Furthermore, the membrane structure 30 can be used as gate electrode for controlling the transistor 10.

The described manufacturing process allows the integration of a pressure sensitive active device, i.e., a pressure sensitive field effect transistor 10 based on the technology for manufacturing capacitive pressure sensors, i.e., passive devices.

As an output signal, the change of the channel resistance and the drain current strength (intensity) can be respectively detected in dependence on the ambient pressure P acting on the membrane structure 30. If the pressure sensitive transistor 10 is operated as an amplifier, the change of the drain current strength is multiplied with the value of the internal resistance of the pressure sensitive transistor 10 and can be measured at the transistor output as the change of the drain-source voltage $\Delta V_{DS}$. Thereby, amplification by several orders of magnitude is possible, which can significantly increase the sensitivity of the device 10. Moreover, a further scaling of the sensor device 10 is possible, which is hardly to realize in (passive) capacitive pressure sensors.

In the following, referring to FIGS. 2A-2L an exemplary process flow of the method 100 for manufacturing the pressure sensitive transistor 10 is described. FIGS. 2A-2L show schematic cross-sectional views of a substrate and the (at the respective process stage) manufactured elements at several process stages of the method 100 for manufacturing the pressure sensitive transistor 10.

With respect to the following description, it is pointed out the fact that the term "process area" is used as the exposed surface portion(s) of the substrate 12 and/or of the further device elements already manufactured in and/or on the substrate 12, wherein the respective doping or deposition step is applied to the accessible "process area".

FIG. 2A—Optional STI module: As shown in FIG. 2A, a semiconductor substrate 12 may be provided with a STI structure 14 (STI=shallow trench isolation) for defining a transistor process area 12-1 in the semiconductor substrate 12. The transistor process area 12-1 is laterally confined or circumscribed by trenches 14-1, 14-2 in the semiconductor substrate 12 which are filled an isolation material. The isolation trenches 14-1, 14-2 are generated in the substrate 12 and are filled with the isolation material, e.g., silicon oxide SiO. The STI structure 14 can define the transistor process area 12-1 and, thus, the resulting geometry of the pressure sensitive transistor 10 to be formed.

The STI structure 14 is an integrated circuit feature which is intended to prevent electric current leakage between adjacent semiconductor device components. The STI structure 14 may by created early during the semiconductor device fabrication process, before transistors are formed. The key steps of the STI process involve etching a pattern of trenches in the substrate, depositing one or more dielectric materials, such as silicon dioxide, to fill the trenches, and removing the excess dielectric using a technique such as CMP (CMP=chemical mechanical planarization/polishing).

Figure 2B:
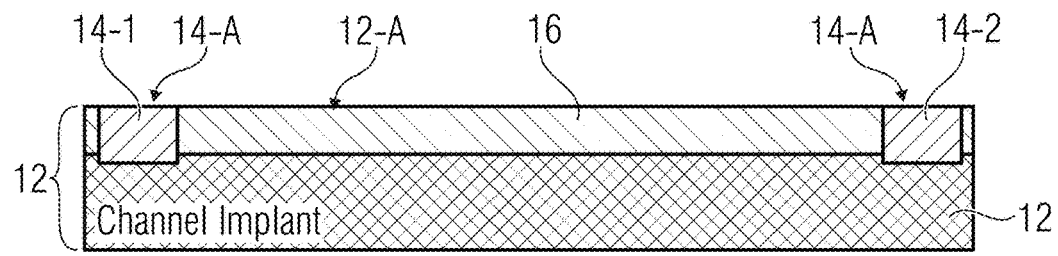
Figure 2C:
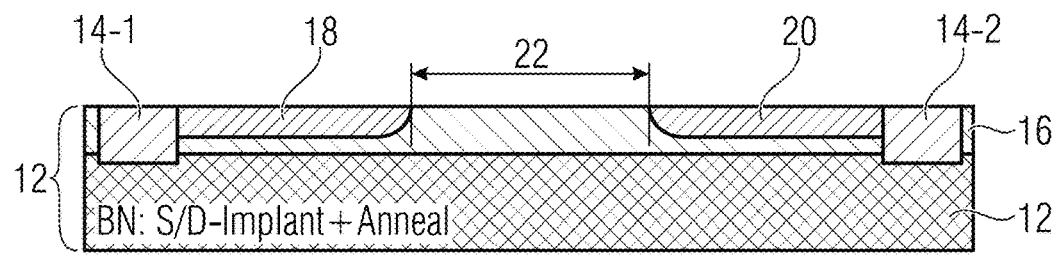

FIGS. 2B-2C Implantation module: In step no, a channel region is formed between a first contact region and a second contact region in the semiconductor substrate 12.

For example, in FIG. 2B, the process surface is formed by the main surface 12-A of the semiconductor substrate 12 and the exposed surface 14-A of the STI structure 14.

As is shown in FIG. 2B, the semiconductor substrate 12 is doped by ion implanting dopants of a first doping type in the semiconductor substrate 12 for providing a doped region 16 having a first doping concentration of the first doping type. The first doping type is, for example, a p-doping with an exemplary doping concentration between $10^{15}$ cm$^{-3}$ and $10_{18}$ cm$^{-3}$.

As shown in FIG. 2C the semiconductor substrate 12 is subsequently doped by ion implanting dopants of the second doping type in the semiconductor substrate 12 for providing the first contact region 18 and the second contact region 20 having the second doping type with a second doping concentration between $10^{19}$ cm$^{-3}$ and $5*10^{20}$ cm$^{-3}$, which is higher than the first doping concentration. Thus, the first and second contact regions 18, 20 in the semiconductor substrate 12 may comprise an n$^+$-doping. Thus, the first contact region 18 may form a drain region and the second contact region 20, which is laterally spaced apart from the first contact region 18, may form a source region of the pressure sensitive transistor, wherein the channel region 22 is laterally confined between the first contact region 18 and the second contact region 20.

Thus, the channel 22 as well as the drain- and source regions 18, 20 are doped by ion implantation, wherein exemplary p-type doping materials (dopants) may comprise boron, aluminum, gallium, indium, etc., and exemplary n-type doping materials (dopants) may comprise phosphorous, arsenic, antimony, bismuth, lithium, etc.

Moreover, an annealing step (heat treatment) is conducted, for example, in order to activate and localize the doping materials within semiconductor substrate 12.

With regard to the above-described specifications for the doping types and doping concentrations of the different regions of the semiconductor substrate 12, it should be noted that complementary doping types may be utilized in accordance to embodiments.

Figure 2D:
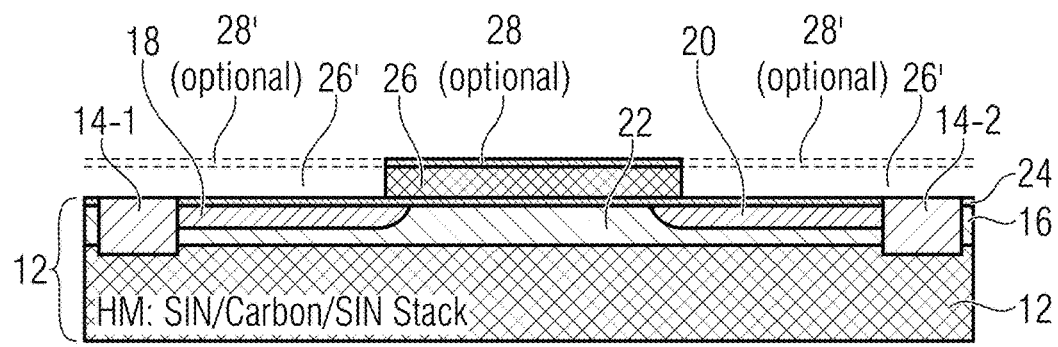

FIG. 2D Sacrificial Layer module: In step 120, a first isolation layer 24 is formed on the main surface 12-A of the semiconductor substrate 12. To be more specific, the first isolation layer 24 is formed by depositing, e.g., by a CVD process, on the main surface 12-A of the semiconductor substrate 12, i.e., the process surface of FIG. 2C, wherein the first isolation layer 24 forms a control electrode dielectric (gate dielectric) of the pressure sensitive transistor 10. The first isolation layer 24 may comprise a silicon nitride-material or silicon oxide-material or a combination of both and may comprise at least in the area above the channel region 22 a thickness in a range between 20 nm and 50 nm.

In step 130, a sacrificial structure 26 is formed on the first isolation layer 24 and at least above the channel region 22. To be more specific, the step 130 of forming the sacrificial structure 26 comprises depositing a sacrificial layer 26' on the first isolation layer 24 wherein the deposited sacrificial layer 26' is structured to form the sacrificial structure 26, wherein the sacrificial structure 26 covers (e.g., with respect to a vertical projection to the main surface 12-A of the semiconductor substrate 12) the channel region 22 and covers (e.g., with respect to a vertical projection to the main surface 12-A of the semiconductor substrate 12) at least partially the first and second contact regions 18 and 20 in the semiconductor substrate 12.

The sacrificial structure may comprise a sacrificial material, e.g. a carbon material, and may have a thickness in the range between 10 nm and 100 nm.

The sacrificial structure 26 may be structured to be symmetrically arranged over the channel region 22 and with respect to the first and second contact regions 18, 20 in the semiconductor substrate 12. As shown in FIG. 4D, the sacrificial structure 26 completely overlaps or covers (with respect to a vertical projection to the main surface 12-A of the semiconductor substrate 12) the channel region 22 in the semiconductor substrate 12.

A further isolation layer 28' is formed on the sacrificial layer 26', so that the sacrificial layer 26' is sandwiched or interposed between the first isolation layer 26 and the further isolation layer 28'. The further isolation layer 28' is used as a hard mask for structuring the sacrificial layer 26' so that the sacrificial structure 26 is sandwiched or interposed between the first isolation layer 24 and the structured further isolation layer 28. The further isolation layer 28 may comprise silicon nitride-material or silicon oxide-material in the thickness range between 15 nm and 40 nm and can be optionally removed by means of selective chemical wet etch process after structuring of sacrificial layer 26.

To summarize, the gate dialectic 24 and a sacrificial layer 26' (and optionally a further isolation layer 28' on the sacrificial layer) are deposited, e.g. as a layered stack, on the semiconductor substrate 12. Subsequently, the sacrificial layer 26' and, if present, the further isolation layer 28' are structured.

Figure 2E:
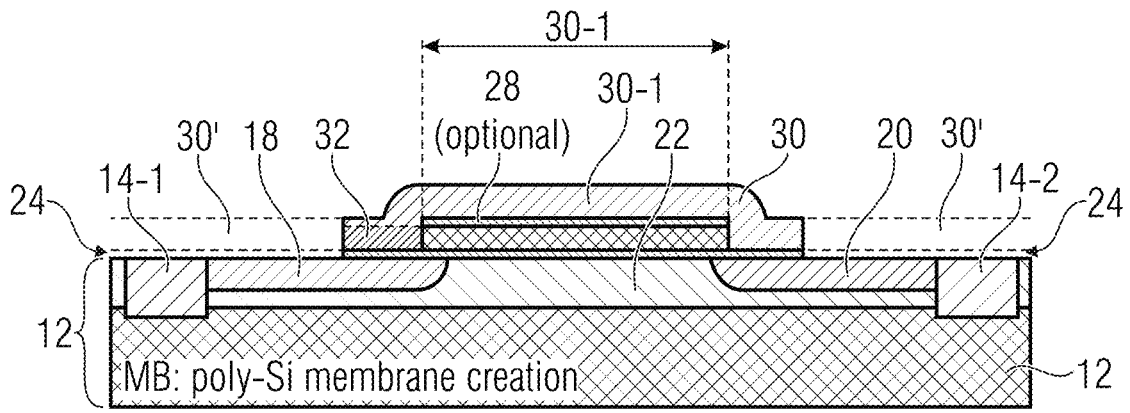

FIG. 2E Membrane Module: In step 140, a semiconductor layer 30' is formed on the sacrificial structure 26 and on the first isolation layer 24, wherein the semiconductor layer 30' covers the sacrificial structure 26 and e.g. an exposed portion of the first isolation layer 24 on the main surface 12-A of the semiconductor substrate 12. As shown in FIG. 2E, the optional further isolation layer 28 may be formed on an upper main surface of the sacrificial structure 26 and may thus be sandwiched between the sacrificial structure 26 and the semiconductor layer 30'.

To be more specific, the step 140 of forming the semiconductor layer 30 may be conducted by depositing an amorphous semiconductor material as the semiconductor layer 30' on the sacrificial structure 26 and the first isolation layer 24, wherein the semiconductor layer 30' covers the sacrificial structure 26 and (the exposed portions of) the first isolation layer 24, except for at least one release opening 32 to the sacrificial structure 26. The at least one release opening 32 provides an access path for an etchant to the sacrificial structure 26 in the cavity 34.

Then, the semiconductor layer 30' is structured for providing the membrane structure 30 adjacent to the cavity 34. Further, the release opening(s) 32 may be formed during structuring the semiconductor layer 30', for example. Optionally, the first isolation layer 24 may also be structured so that the lateral outer edge (border) of the first isolation layer 24 is conformed to the lateral outer edge of the membrane structure 30 (structured semiconductor layer), as shown in FIG. 2E.

The semiconductor layer 30' and, thus, the membrane structure 30 may comprise an amorphous semiconductor material, e.g., amorphous silicon material, having a thickness in a range between 200 nm and 500 nm.

In step 150, the sacrificial structure 26 is removed for providing the cavity 34 between the substrate 12 and the membrane structure 30 wherein the membrane structure 30 has a vertically displaceable or deformable center region 30-1 and forms a control electrode (gate electrode) of the pressure sensitive transistor 10. To be more specific, the sacrificial structure 26 is removed through the at least one release opening 32 for providing the cavity 34 between the semiconductor substrate 12 and the membrane structure 30 (structured semiconductor layer).

Then, the membrane structure (structured semiconductor layer) 30 is annealed (heat treated), for example, in order to recrystallize amorphous silicon to polycrystalline silicon material.

By providing the cavity 34 between the semiconductor substrate 12 and the membrane structure 30, at least a center portion 30-1 of the membrane structure 30 is displaceable in a direction vertical to the main surface 12-A of the semiconductor substrate 12 and may respond to a changed pressure difference ΔP between the environment and the inner volume of the cavity 34, if the cavity 34 is hermetically sealed against the environment, i.e., after having sealed the at least one release opening 32 (see step 160 below).

To summarize, in the membrane module (steps 140 and 150), a semiconductor layer 30' having an amorphous semiconductor, e.g., amorphous silicon, is deposited on the sacrificial structure 26 and structured to form the membrane structure 30. Then, the sacrificial structure 26 is removed and the amorphous semiconductor material, e.g., amorphous silicon, is recrystallized with an oven process, i.e., during an annealing step (heat treatment).

Figure 2F:
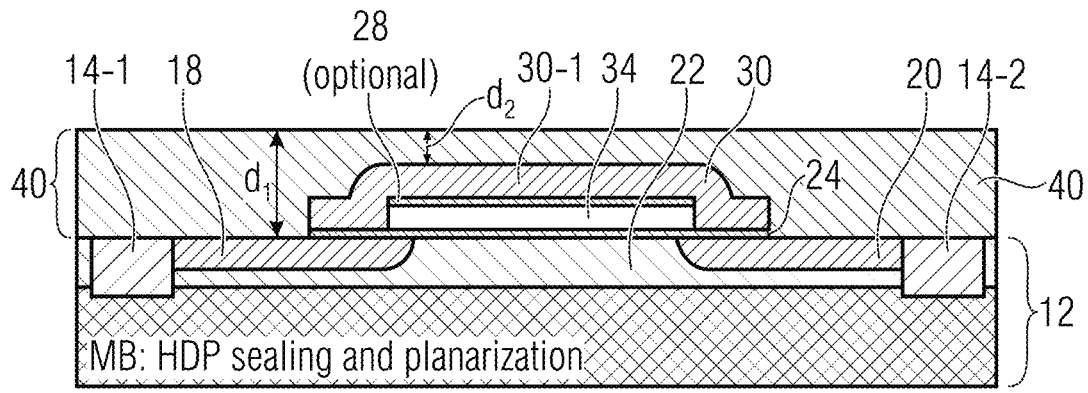

FIG. 2F Cavity Sealing: In step 160, a second isolation layer (or isolation layer stack) 40 is formed on the membrane structure 30 and on the exposed portion of the main surface 12-A of the semiconductor substrate 12 and, laterally to the membrane structure, on the semiconductor substrate 12, e.g. on an exposed portion of the first isolation layer 24 on the main surface 12-A of the semiconductor substrate 12 and/or on an exposed portion of the main surface 12-A of the semiconductor substrate 12, i.e., on the process area.

The isolation layer (stack) 40 may comprise at least one isolation layer or a plurality (stack) of isolation layers.

To be more specific, the step 160 of forming the second isolation layer 40 may comprise a deposition of the second isolation layer 40 with a CVD process (CVD=chemical vapor deposition) or a HDP-CVD process (HDP=high density plasma) on the membrane structure 30 for sealing the cavity 34 under low pressure or near vacuum, wherein the low pressure in the cavity 34 corresponds to the process pressure of the CVD process or HDP-CVD process so that the hermetically sealed cavity 34 is formed between the semiconductor substrate 12 and the opposing membrane structure 30.

The second isolation layer may comprise a silicon oxide or silicon nitride material. Moreover, the CVD process or HDP-CVD process may comprise a process pressure of e.g., between 0.1 and 30 mTor, between 0.5 and 10 mTor or between 1 and 3 mTor.

Providing a low pressure or near vacuum in the cavity 34 provides a very low temperature dependency of the output signal of the pressure sensitive transistor 10 as a vacuum does not have a temperature dependency (of the pressure).

Then, the deposited second isolation layer 40 may be planarized by means of a CMP process (CMP=chemical mechanical polishing/planarization). The resulting second isolation layer 40 may comprise a thickness $d_1$ over the main surface 12-A of the semiconductor substrate 12 between 400 nm and 1000 nm, and may comprise a further thickness $d_2$ over the deformable portion 30-1 of the membrane structure 12 in a range between 100 nm and 500 nm.

Figure 2G:
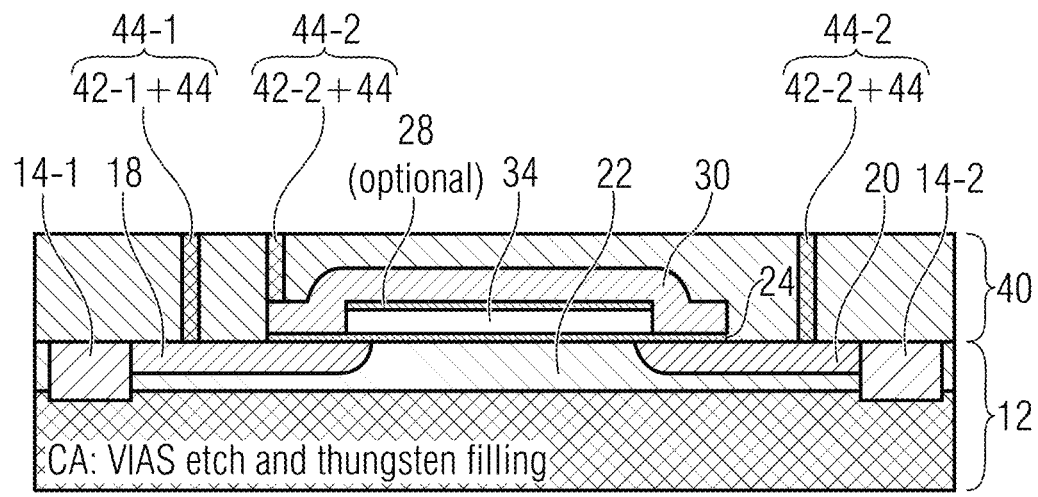

FIG. 2G Via-Module: In step 170, contacting structures 44-1, 50-1, 44-2, 50-2, 44-3, 50-3 for the first contact region 18, the second contact region 20 and the membrane structure 30 of the pressure sensitive transistor 10 are formed.

As shown in FIG. 2G, respective through holes or trenches 42-1, 42-2, 42-3 are etched in the second isolation layer 40 to the first contact region 18, the second contact region 20 and the membrane structure 30, respectively. In case the first isolation layer 24 covers the first contact region 18 and/or the second contact region 20, the through holes or trenches 42-1, 42-3 are also etched through the first isolation layer 24, if present.

Then, the through holes or trenches 42-1, 42-2, 42-3 are filled with a conductive material 44 to form conductive vias 44-1, 44-2, 44-3 to the first contact region 18, to the second contact region 20 and to the membrane structure 30, respectively. According to an embodiment, the through holes or trenches 42-1, 42-2, 42-3 may be filled with a Ti/TiN liner and a tungsten material to form the conductive vias 44-1, 44-2, 44-3.

To summarize, in the via module, the trenches or through holes 42-1, 42-2, 42-3 for contacting the transistor 10 are etched and filled with a conductive material, e.g., at Ti/TiN liner as well as tungsten.

Figure 2H:
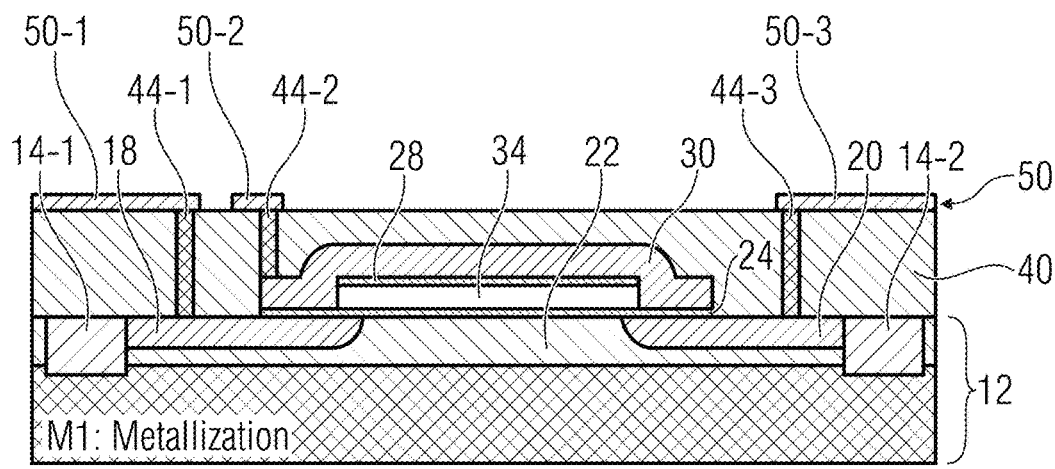

FIG. 2H Metal Module ($M_1$ layer): as shown in FIG. 2H, a conductive layer 50, e.g., a metal layer, is deposited on the second isolation layer 40 and the conductive vias 44-1, 44-2, 44-3 formed therein, wherein the conductive layer 50 is in electrical contact with the conductive material 44 in the vias 44-1, 44-2, 44-3. The metal layer 50 may be, for example, the $M_1$-layer of the BEOL stack.

Then, the metal layer 50 is structured for providing isolated contact areas 50-1, 50-2, 50-3 for the first contact region 18 and the second contact region 20 in the semiconductor substrate 12 and for the membrane structure 30, respectively.

As shown in FIG. 2H, the first contact area 50-1, is connected over the first conductive via 44-1 with the first contact region (drain) 18, wherein the second contact area 50-2 is connected over the second via 44-2 with the membrane structure (gate electrode) 30, and wherein the third contact area 50-3 is connected over the third conductive via 44-3 to the second contact region (source) 20 in the semiconductor substrate 12.

So summarize, during the metal module, the metal layer 50 is deposited on the second isolation layer (or isolation layer stack) 40 and structured to form the isolated contact areas 50-1, 50-2, 50-3.

Figure 2I:
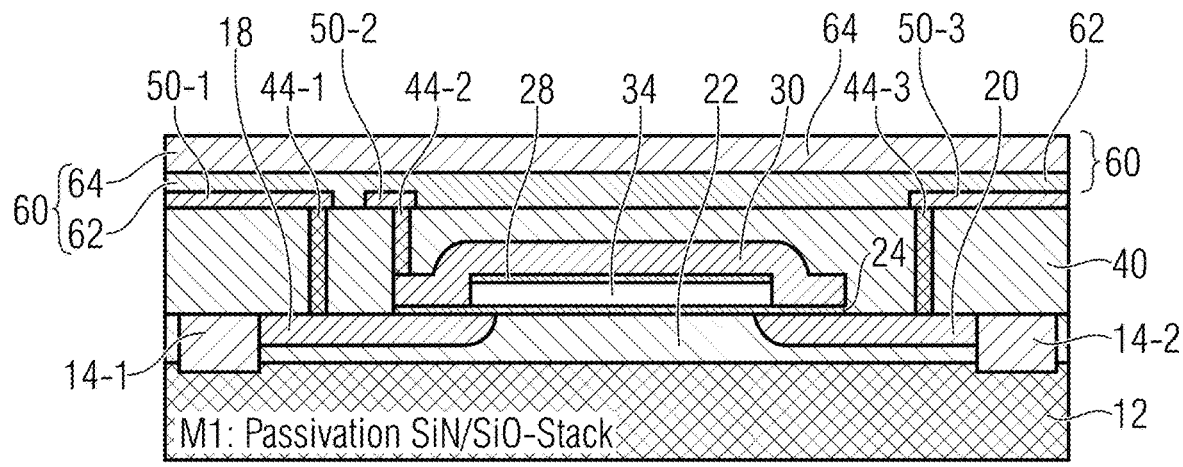

As shown in FIG. 2I, a passivation layer or passivation layer stack 60 may be deposited to the isolated contact areas (contact pads) 50-1, 50-2, 50-3 and optionally to the exposed areas/portions of the second isolation layer 40. The passivation layer 60 is deposited for covering and protecting the structured metal layer 50 which forms the separated contact areas 50-1, 50-2, 50-3. As shown in FIG. 2I, the passivation layer/structure may comprise a plurality of different isolation layers 62, 64, e.g., a SiN/SiO stack (SiN=silicon nitride 62, SiO=silicon oxide 64).

To summarize, for protecting the metal traces 50-1, 50-2, 50-3, the passivation layer 60 (e.g., an isolation layer stack) is deposited.

Figure 2J:
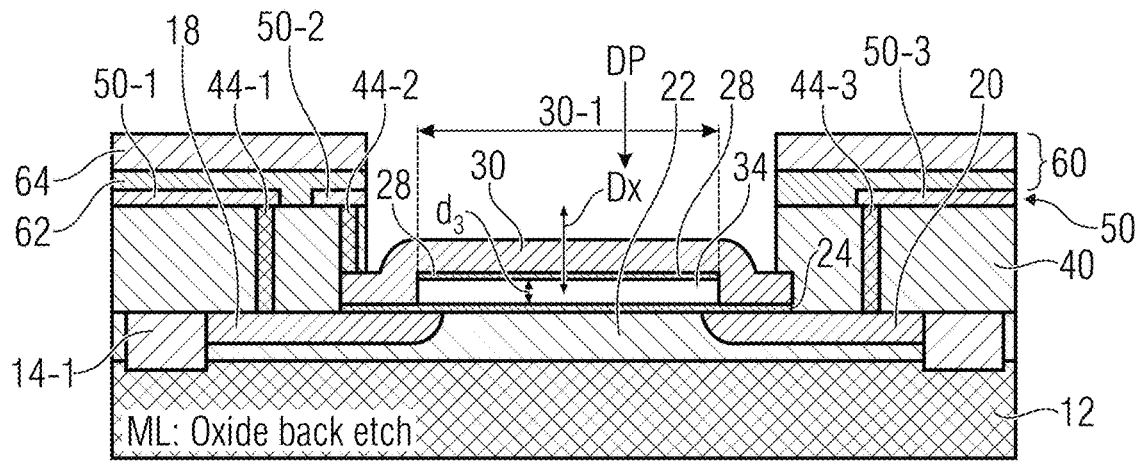

As shown in FIG. 2J, the membrane structure 30 or at least the displaceable center portion 30-1 of the membrane structure 50 is exposed or divested by removing at least the portions the second isolation layer 40 and the passivation layer 60 covering the membrane structure 30 and/or at least the displaceable portion 30-1 of the membrane structure 30 so that the exposed membrane structure, i.e., the exposed portion of the membrane structure 30, is in a fluid communication with the environment. However, when exposing the membrane structure 30, the at least one release opening 32 remains sealed and closed for maintaining the hermetically sealed cavity 34. The removal of the second isolation layer 40 and the passivation layer 60 can be conducted by an etching process, e.g., a vertical etching process or a so-called oxide back etch process.

Exposing the membrane structure 30 and/or at least the displaceable portion 30-1 of the membrane structure 30 ensures that a pressure change $\Delta P$ in the sensor environment, the membrane structure 30 is deformed and vertically displaced by $\Delta x$, wherein such as deformation changes the distance $d_3$ by the displacement $\Delta x$ ($d_3 \pm \Delta x$) between the electrodes 22, 30. This results in a change of the capacitance between the electrodes 22, 30 that can be detected as an electric signal.

Figure 2K:
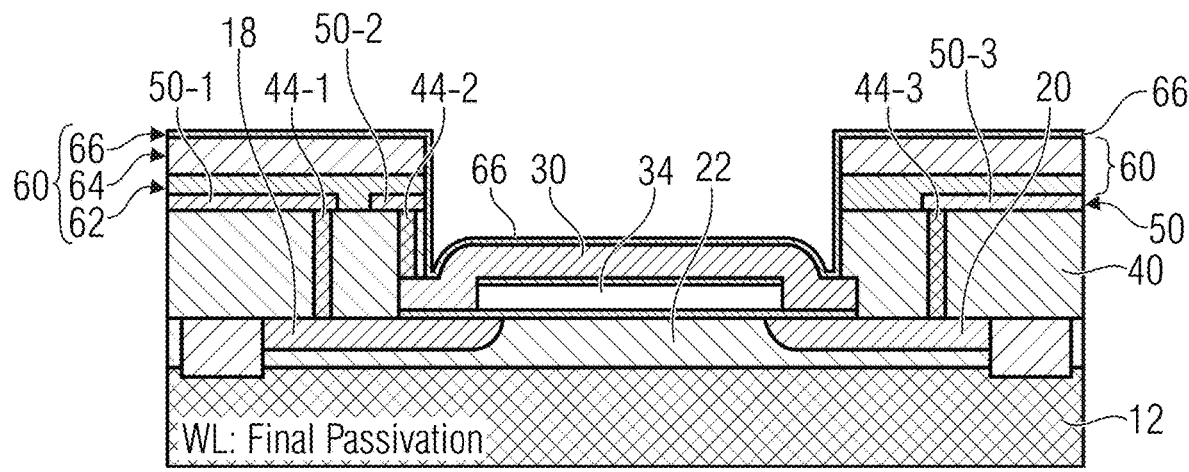

As shown in FIG. 2K, a further passivation layer 66 may be deposited on the exposed portions of the membrane structure 30 and the exposed portions of the second isolation layer 40 and the passivation layer (stack) 60. In other words, a final passivation layer or layer stack 66 is formed on the exposed membrane structure 30 and the remaining exposed isolation layers 40, 60.

Figure 2L:
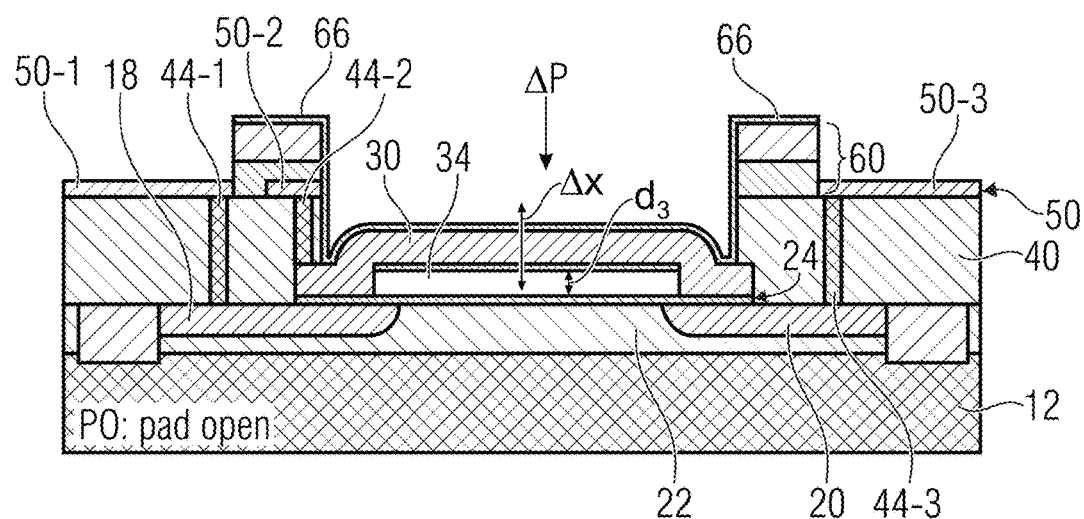

As shown in FIG. 2L, the contact areas 50-1, 50-2, 50-3 for the first contact region, the second contact region 18, 20 and the membrane structure (control electrode) 30 of the pressure sensitive transistor 10 are at least partially exposed by selectively removing the portions of the passivation layers 60 and the further passivation layer 66 which cover the different contact areas 50-1, 50-2, 50-3 of the structured metal layer 50. Thus, for exposing the contact areas 50-1, 50-2, 50-3 the respective isolation material (vertically) covering the different contact areas 50-1, 50-2, 50-3 of the structured metal layer 50 is removed. This process is called a pad opening process (pad=contact area).

To summarize, the passivation 40, 60 over the membrane structure, i.e., the displaceable portion 30-1 of the membrane structure 30, is etched (FIG. 2J). The exposed membrane structure 30 is subsequently passivated with a thin silicon nitride layer 66, having a thickness in the range between 15 nm and 50 nm. (FIG. 2K). Then, the metal areas 50-1, 50-2, 50-3 (pads) intended for contacting the device i.e., the pressure sensitive transistor, 10 are exposed by etching (FIG. 2L).

Figure 3:
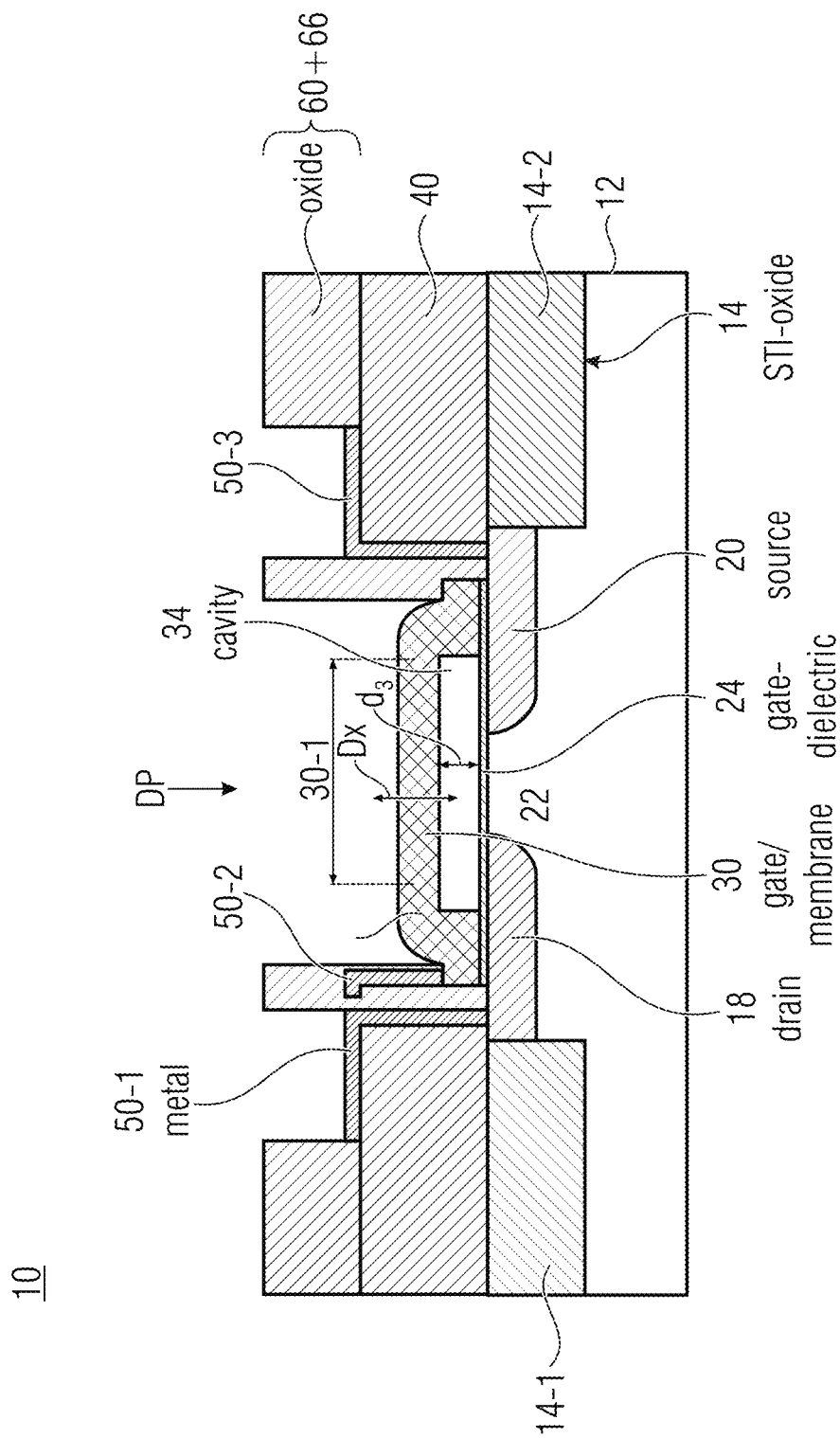
FIG. 3 shows a schematic cross-sectional view of a pressure sensitive transistor according to an embodiment.

FIG. 3 shows a schematic cross-sectional view of a pressure sensitive transistor 10 achieved by the method 100 for manufacturing a pressures sensitive transistor as described with respect to FIG. 1 and FIGS. 2A-2L.

As shown in FIG. 3, the pressure sensitive transistor (FET) 10 comprises a channel region 22 between the first contact region (drain) 18 and the second contact region (source) 20 in the semiconductor substrate 12. The semiconductor substrate 10 has, for example, a STI structure 14 (STI=shallow trench isolation) for defining the transistor area in the semiconductor substrate 12. The STI structure 14 may comprise trenches 14-1, 14-2 in the semiconductor substrate 12 which are filled with an isolation material, e.g., a silicon oxide.

The channel region 22 comprises a first doping type with a first doping concentration. The first and second contact areas 18, 20 comprise a second doping type (complimentary to the first doping type) with a second doping concentration which is higher than the first doping concentration.

A first isolation layer 24, which forms a control electrode dielectric or gate dielectric, is arranged on the semiconductor substrate 12 and (e.g. completely) covers the channel region 22 and at least partially covers the first and second contact regions 18, 20. A membrane electrode 30 is arranged on the control electrode dielectric 24 and provides a sealed cavity 34 between the semiconductor substrate 12 (e.g. between the control electrode dielectric 24 on the semiconductor substrate 12) and the opposing membrane structure 30. A second isolation layer 40 is at least laterally arranged to the membrane structure 30 for hermetically sealing the cavity 34 between the membrane structure 30 and the semiconductor substrate 12.

Contact pads (contact areas) 50-1, 50-2, 50-3 are connected over vias 44-1, 44-2, 44-3 with the first contact region 18, the second contact region 20, and the membrane structure (gate electrode) 30, respectively of the pressure sensitive transistor 10. Furthermore, a final passivation layer or passivation layer stack 60, 66 is arranged on the transistor 10 comprising opening for the contact pads 50-1, 50-2, 50-3.

By providing the hermetically sealed cavity 34 between the semiconductor substrate 12 and the membrane structure 30, an exposed center portion 30-1 of the membrane structure 30 is displaceable in a vertical direction and may respond to a changed pressure difference $\Delta P$ between the environment and the inner volume of the cavity 34.

Based on a pressure change $\Delta P$ in the sensor environment, the membrane structure 30 is deformed and vertically displaced by $\Delta x$, wherein such as deformation changes the distance $d_3$ by the displacement $\Delta x$ ($d_3 \pm \Delta x$) between the electrodes 22, 30. This results in a change of the capacitance between the electrodes 22, 30 that can be detected as an electric output signal which can be tapped at the contact pads 50-1, 50-2, and 50-3.

FIGS. 4A-4D show schematic plan views of different design variations of the pressure sensitive transistor 10 of FIG. 3 that differ by the geometry of the membrane structures 30 and the transistor 10, e.g. the dimensions (length l and width w) of the channel region 22.

Figure 4A:
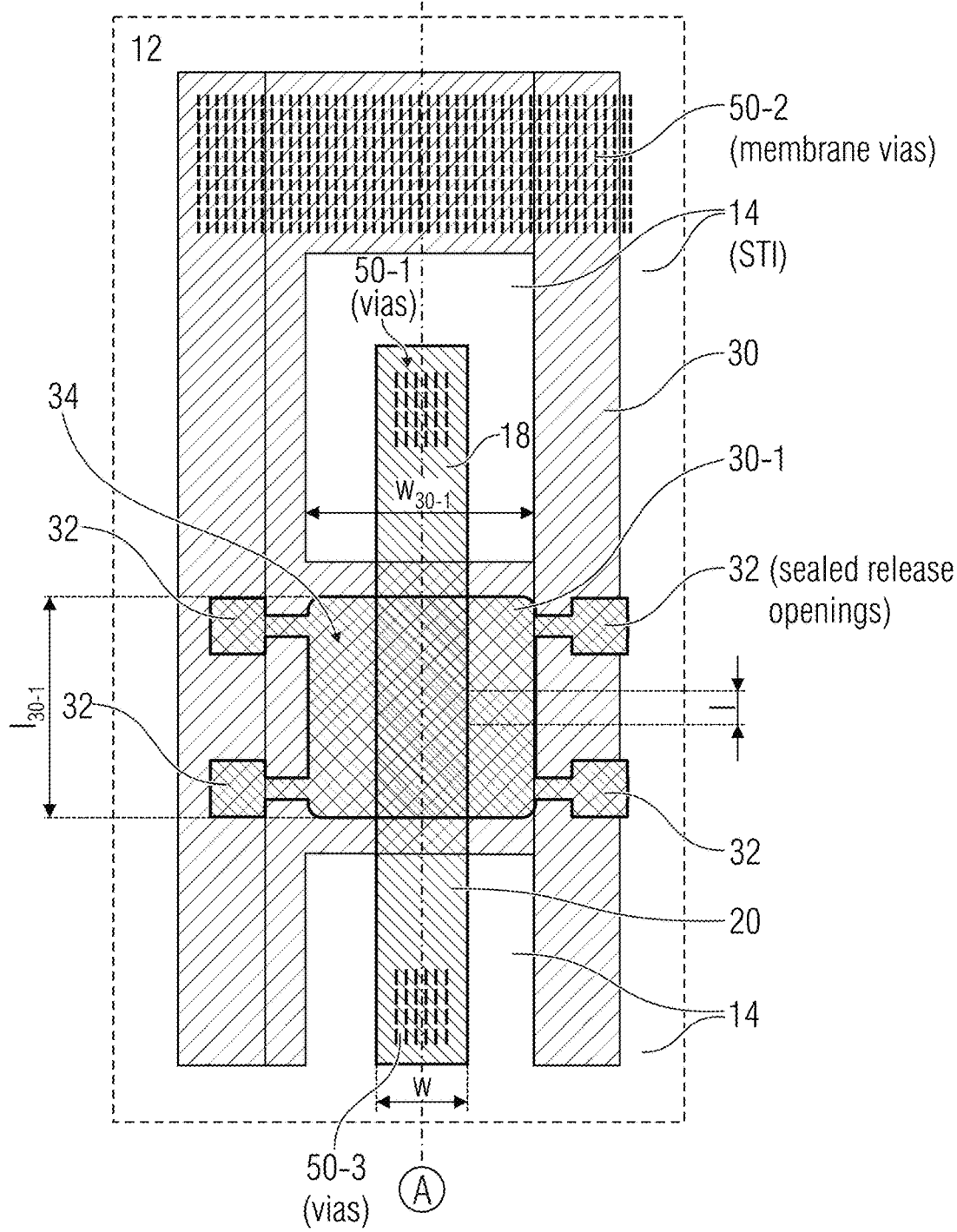
FIGS. 4A-4D show schematic plane views with different exemplary design variants together with typical dimensions of the pressure sensitive transistor according to further embodiments.

As shown in the plan view of FIG. 4A, the pressure sensitive transistor 10 is implemented in a single cell configuration having the discrete transistor 10 with one sensor membrane 30-1 over one channel region 22. FIG. 4A shows a (dashed) cutting line AA, wherein FIGS. 2L and 3 provide, for example, a schematic cross-sectional view of the pressure sensitive transistor 10 along the cutting line AA and vertically to the drawing plane (=main surface 12A of the semiconductor substrate 12) of FIG. 4A.

As shown in FIG. 4A, the pressure sensitive transistor (FET) 10 comprises the channel region 22 between the first contact region (drain) 18 and the second contact region (source) 20 in the semiconductor substrate 12. The first isolation layer 24 (not shown in FIG. 4A) forms the control electrode dielectric or gate dielectric and is arranged on the semiconductor substrate 12 and (e.g. completely) covers the channel region 22 and at least partially covers the first and second contact regions 18, 20. The membrane electrode 30 having the displaceable portion 30-1 is arranged on the control electrode dielectric 24 and provides a sealed cavity 34 between the semiconductor substrate 12 and the opposing membrane structure 30. The channel region 22 extends below the displaceable portion 30-1 of the membrane structure 30. The second isolation layer 40 (not shown in FIG. 4A) is at least laterally arranged to the membrane structure 30 for hermetically sealing the release opening(s) 32 and, thus, the cavity 34 arranged between the membrane structure 30 and the semiconductor substrate 12. The contact pads 50-1, 50-2, 50-3 are connected to the first contact region 18, the second contact region 20, and the membrane structure (gate electrode) 30, respectively of the pressure sensitive transistor 10.

As shown in FIG. 4A, the single cell pressure sensitive transistor 10 is implemented with a single channel and a single membrane structure 30. The channel width w may be in the range between 1 and 20 µm, or between 2 and 10 µm or between 3 and 7 µm and may comprise, for example, a width of 5 µm. The channel length l may be in the range between 0.1 and 10 µm, or between 0.2 and 5 µm or between 0.5 and 2 µm and may comprise, for example, a length of 0.5, 1 or 2 µm or any intermediate value thereof.

As shown in FIG. 4A, the dimensions of membrane structure 30 (e.g. the displaceable portion 30-1 of the membrane structure 30) depend on the dimensions of the channel region 22. Thus, the displaceable portion 30-1 of the membrane structure 30 may comprise a width $w_{30-1}$ in the range between 6 and 24 µm, or between 10 and 14 µm and may comprise, for example, a width of 12 µm. Thus, the displaceable portion 30-1 of the membrane structure 30 may comprise a length $l_{30-1}$ in the range between 6 and 24 µm, or between 10 and 14 µm and may comprise, for example, a length of 12 µm. As shown in FIG. 4A, the membrane structure 30 may comprise a square footprint or may comprise any other adequate shape.

Figure 4B:
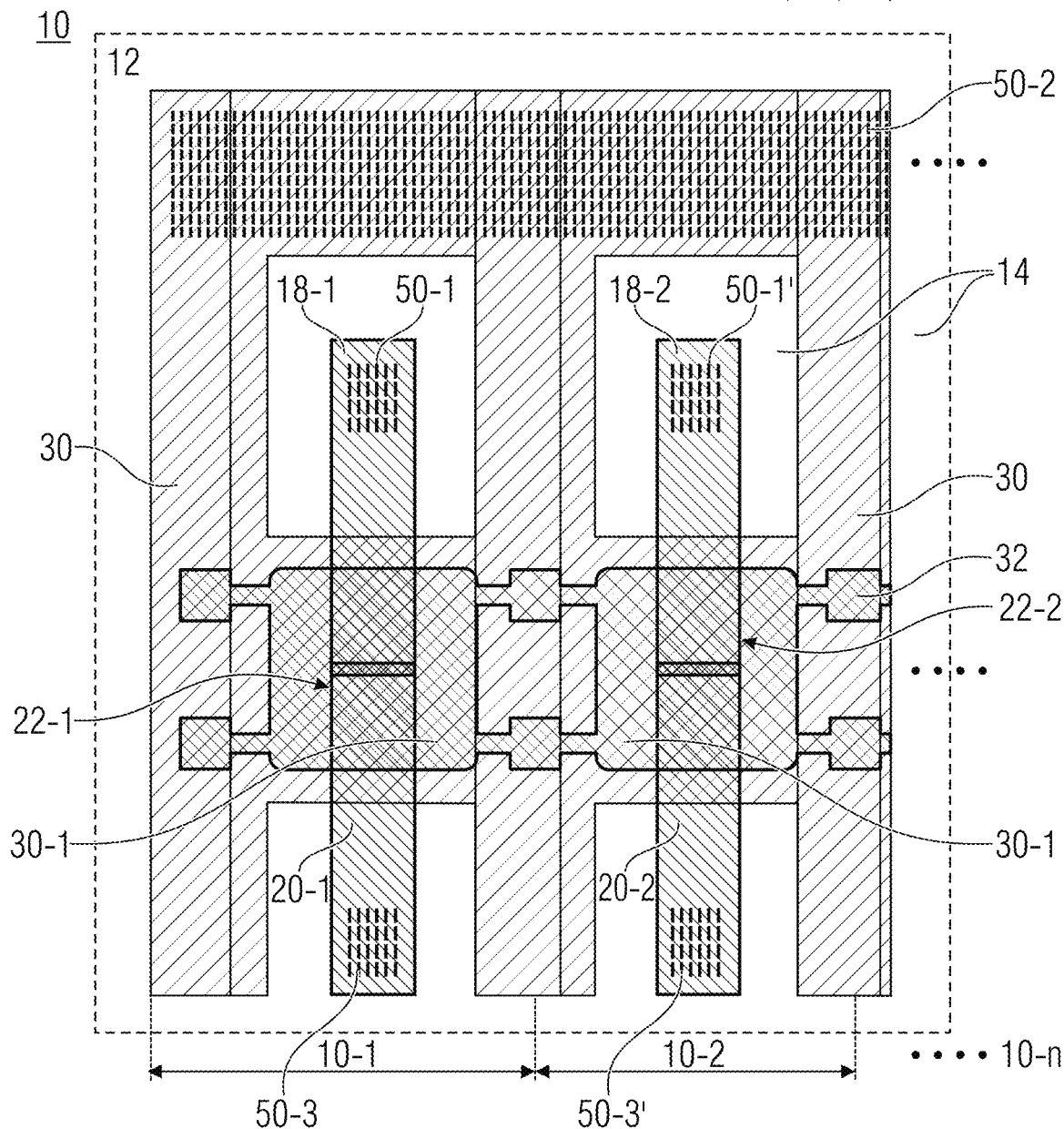

As shown in the plan view of FIG. 4B, the pressure sensor arrangement with the pressure sensitive transistor 10 is implemented in a multiple cell configuration having multiple discrete transistors 10-1, . . . 10-n with n=2, 3, 4, . . . 100, or n=4, 8, 16, 32, 64 . . . , for example. Each transistor 10-n may have one sensor membrane 30-1 over one channel region 22-n. The n discrete transistors 10-1, 10-2 . . . 10-n of FIG. 4B may be parallel connected and/or may be arranged in an array. Each of the discrete transistors 10-1, 10-2 . . . 10-n of FIG. 4B may comprise the structure and the dimensions of the pressure sensitive transistor (FET) 10 of FIG. 4A.

Figure 4C:
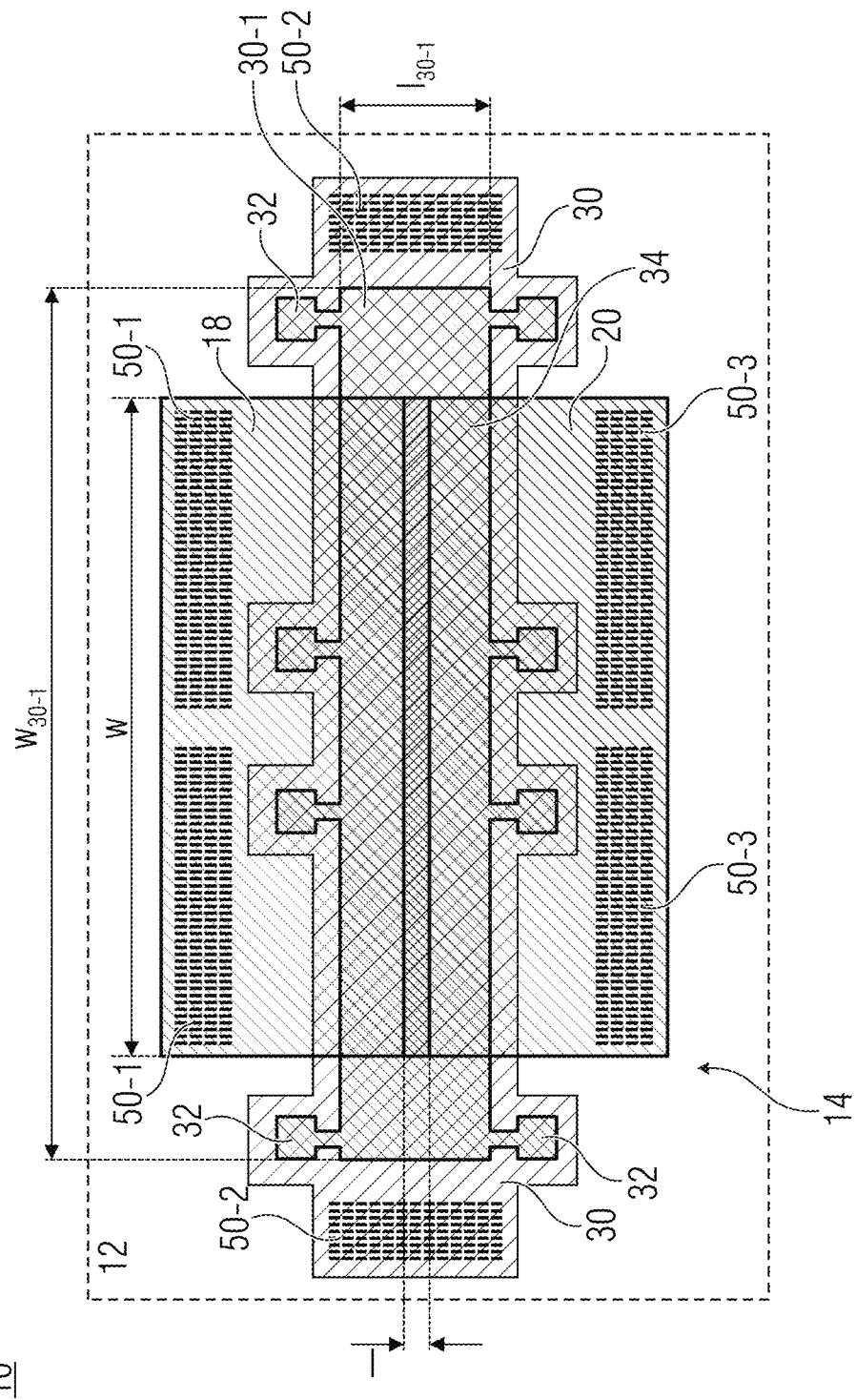
Figure 4D:
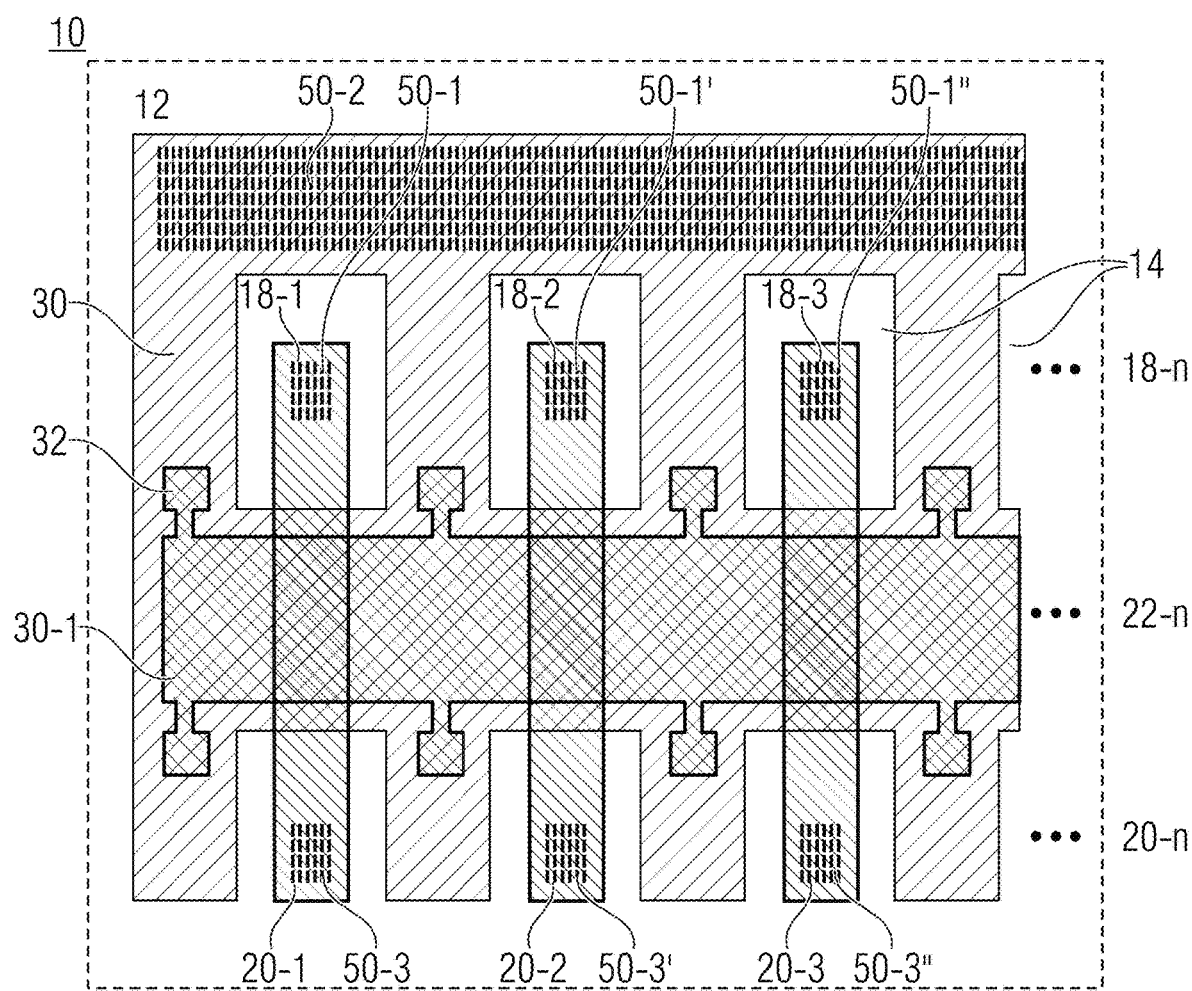

As shown in the plan view of FIG. 4C, the pressure sensitive transistor 10 is implemented in a single cell configuration having the discrete transistor 10 with one "long" sensor membrane 30-1 over one "wide" channel region 22.

As shown in FIG. 4C, the pressure sensitive transistor (FET) 10 comprises the long channel region 22 between the first contact region (drain) 18 and the second contact region (source) 20 in the semiconductor substrate 12. The first isolation layer 24 (not shown in FIG. 4C) forms the control electrode dielectric or gate dielectric and is arranged on the semiconductor substrate 12 and (e.g. completely) covers the channel region 22 and at least partially covers the first and second contact regions 18, 20. The membrane electrode 30 having the displaceable portion 30-1 is arranged on the control electrode dielectric 24 and provides a sealed cavity 34 between the semiconductor substrate 12 and the opposing membrane structure 30. The channel region 22 extends below the displaceable portion 30-1 of the membrane structure 30. The second isolation layer 40 (not shown in FIG. 4C) is at least laterally arranged to the membrane structure 30 for hermetically sealing the release opening(s) 32 and, thus, the cavity 34 arranged between the membrane structure 30 and the semiconductor substrate 12. The contact pads 50-1, 50-2, 50-3 are connected to the first contact region 18, the second contact region 20, and the membrane structure (gate electrode) 30, respectively of the pressure sensitive transistor 10.

As shown in FIG. 4C, the single cell pressure sensitive transistor 10 is implemented with a single channel and a single membrane structure 30. The channel width w may be in the range between 10 and 2000 µm, or between 20 and 1500 µm or between 50 and 1000 µm and may comprise, for example, a width of 50, 500, or 1000 µm or any intermediate value thereof. The channel length l may be in the range between 0.1 and 10 µm, or between 0.2 and 5 µm or between 0.5 and 2 µm and may comprise, for example, a length of 0.5, 1 or 2 µm or any intermediate value thereof.

As shown in FIG. 4C, the dimensions of membrane structure 30 (e.g. the displaceable portion 30-1 of the membrane structure 30) depend on the dimensions of the channel region 22. Thus, the membrane structure 30 may comprise an adequate width $w_{30-1}$ and length $l_{30-1}$ for spanning the channel region 22.

In a further embodiment, a plurality of discrete transistors 10 of FIG. 4C may be parallel connected and/or may be arranged in an array.

As shown in the plan view of FIG. 4D, the pressure sensitive transistor 10 is implemented in a single cell configuration having a plurality (=n, with n=2, 3, 4, 5 . . . ) of discrete transistors 10 with one "long" sensor membrane 30+30−1 over a plurality (=n) channel regions 22-1 . . . 22-n.

As shown in FIG. 4D, the pressure sensitive transistors (FETs) 10-1 . . . 10-n comprise the n channel regions 22-1 . . . 22-n between an associated first contact region (drain) 18-1 . . . 18-n and an associated second contact region (source) 20-1 . . . 20-n in the semiconductor substrate 12. The n channel regions 22-1 . . . 22-n extend below the displaceable portion 30-1 of the membrane structure 30. The second isolation layer 40 is at least laterally arranged to the membrane structure 30 for hermetically sealing the cavity 34 between the membrane structure 30 and the semiconductor substrate 12. The contact pads 50-1, 50-2, 50-3 are connected to the first contact regions 18-1 . . . 18-n, the second contact regions 20-1 . . . 20-n, and the membrane structure (gate electrode) 30, respectively.

As shown in FIG. 4D, the single cell pressure sensitive transistor 10 is implemented with a plurality of channel regions 22-1 . . . 22-n and a single membrane structure 30. The channel width w may be in the range between 1 and 20 µm, or between 2 and 10 µm or between 3 and 7 µm and may comprise, for example, a width of 5 µm. The channel length l may be in the range between 0.1 and 10 µm, or between 0.2 and 5 µm or between 0.5 and 2 µm and may comprise, for example, a length of 0.5, 1 or 2 µm or any intermediate value thereof.

As shown in FIG. 4D, the dimensions of membrane structure 30 (e.g. the displaceable portion 30-1 of the membrane structure 30) depend on the dimension and number of the channel regions 22-1 . . . 22-n. Thus, the membrane structure 30 may comprise an adequate width $w_{30-1}$ and length $l_{30-1}$ for spanning the channel regions 22-1 . . . 22-n. The n discrete transistors 10 of FIG. 4D may be parallel connected.

In a further embodiment, a plurality of discrete transistors 10 of FIG. 4D may be parallel connected and/or may be arranged in an array.

In a further embodiment, the design variations of the transistor 10 as shown in FIGS. 4A-4D may be combined.

Figure 5:
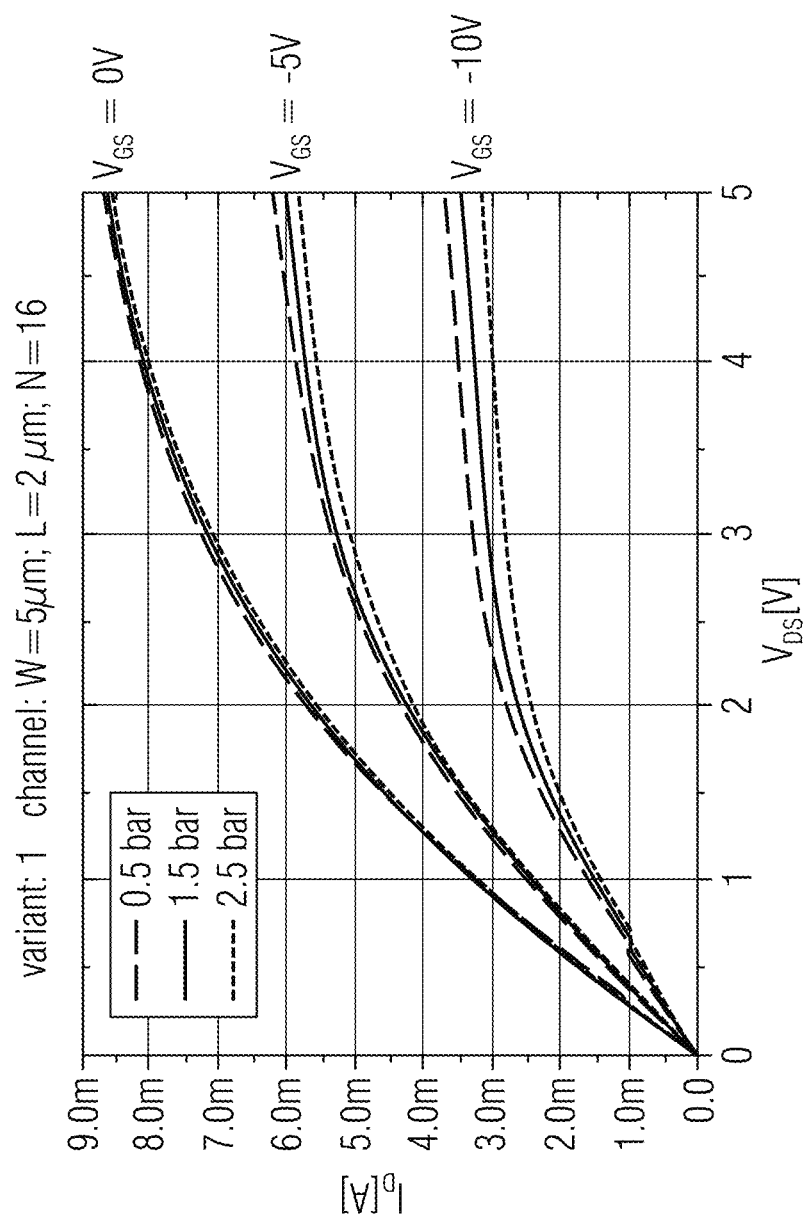
FIG. 5 shows an exemplary output characteristic field sensed for different ambient pressures with the pressure sensitive transistor according to an embodiment.

FIG. 5 shows an exemplary output characteristic field sensed for different ambient pressures P with the pressure sensitive transistor 10 according to an embodiment.

By measuring the output characteristics, the functionality of the transistors 10 of FIGS. 4A-4D can be confirmed for all design variations. Due to the fact that, according to an embodiment, a silicon nitride material has been deposited as gate dielectric 24, a self-conducting (depletion type) n channel field effect transistor 10 can be implemented, for example. The used silicon nitride material of the gate dielectric 24 has a relatively high number of positive charge states which has the effect that the channel 22 is already formed at 0V gate voltage ($V_{GS}$=0V). For blocking the channel 22, a negative voltage has to be applied to the gate electrode 30 (=the membrane structure). All design variations of the transistors 10 of FIGS. 4A-4D show a dependency of the electric characteristics on the environmental pressure P.

To be more specific, the tested design variation for detecting output characteristic field of FIG. 5 comprises 16 transistors 10 of FIG. 4A which are connected in parallel. For each individual transistor 10, the channel width and length are 5 µm and 2 µm, respectively. The edge length of the square sensor membrane 30 above the channel is 12 µm.

In FIG. 5, the drain current intensity $I_D$ is plotted against the drain-source voltage $V_{DS}$ at different gate voltages $V_{GS}$ and pressures P. Therefrom, a dependency of $I_D$ on the pressure P can be detected. At the smallest pressure value of 0.5 bar, the highest current intensity flows, which then decreases again with increasing pressure P. The sensitivity when applying a gate voltage $V_{GS}$ becomes the higher the more negative this voltage is.

Figure 6A:
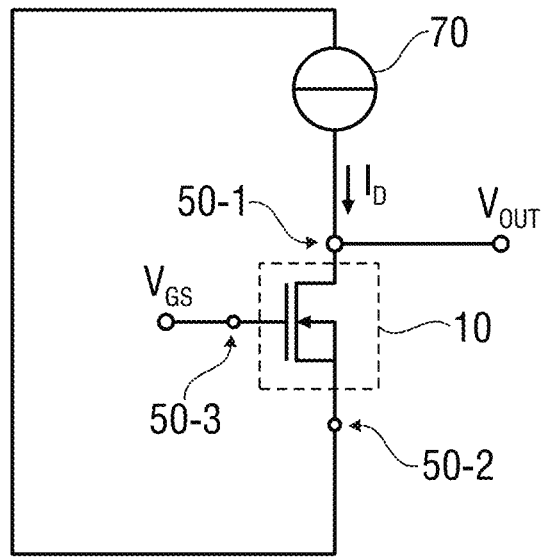
FIG. 6A shows a schematic circuit diagram of the pressure sensitive transistor with a constant current source for adjusting the operation point according to an embodiment.

FIG. 6A shows a schematic circuit diagram 200 of the pressure sensitive transistor 10 with a constant current source 70 for adjusting an operation point of the pressure sensitive transistor 10 according to an embodiment. To be more specific, FIG. 6A shows the connection of the transistor 10 to a constant current source 70 allowing the determination of an operating point. In this implementation, a constant voltage $V_{GS}$ can be applied to the gate electrode 30 and a drain current intensity $I_D$ can be adjusted. During the change in pressure P, the channel resistance $R_{22}$ is increased and reduced, respectively, whereby the voltage has to be adapted by the current source 70 in order to keep the value of the current $I_D$ constant. The voltage drop $V_{OUT}$ across the channel resistance $R_{22}$ is detected as an output signal $V_{OUT}$.

Figure 6B:
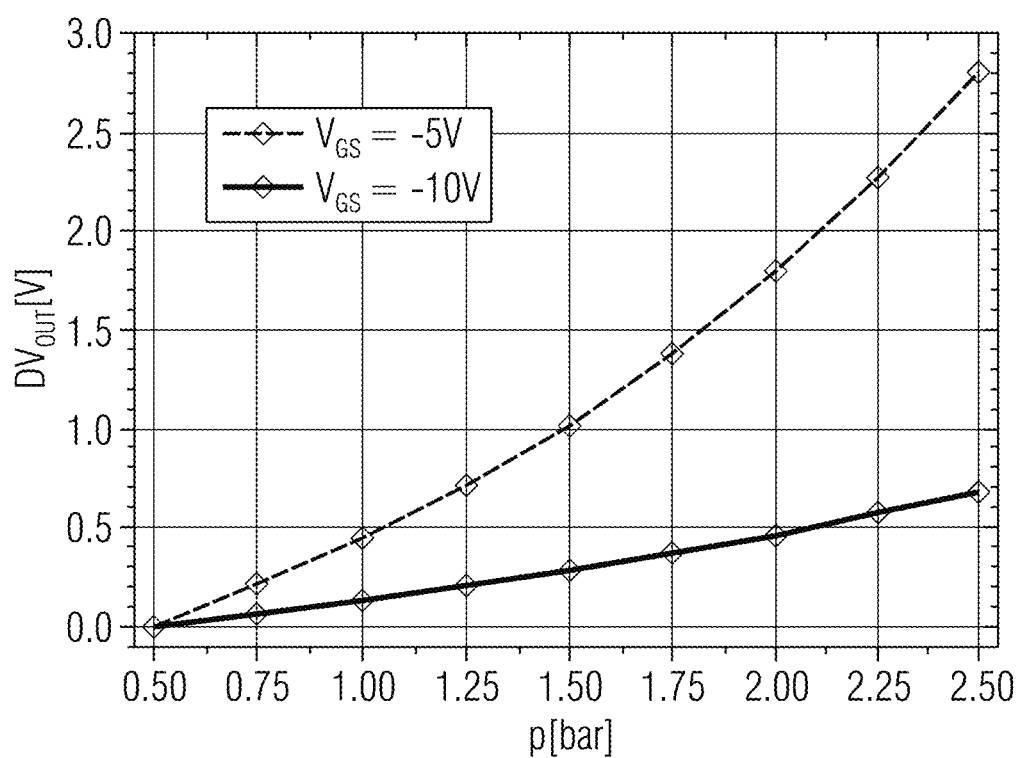
FIG. 6B shows an exemplary output signal in dependency on the pressure at different gate voltages $V_{GS}$ of the pressure sensitive transistor according to an embodiment.

FIG. 6B shows an exemplary output signal $V_{OUT}$ in dependency on the pressure P at different gate voltages $V_{GS}$ of the pressure sensitive transistor 10 according to an embodiment.

In FIG. 6B, the change of $V_{OUT}$($V_{OUT}$(p)-$V_{OUT}$(0.5 bar)) is plotted in dependence on the pressure P. Here, two measurements have been taken at different gate voltages $V_{GS}$ for illustrating the influence on the sensitivity. The result confirms the statement: the more negative the voltage applied at the gate electrode 30 (=membrane structure), the more sensitive is the pressure sensor 10. It has to be mentioned that the pressure change ΔP has been performed in 0.25 bar steps, first from 0.5 to 2.5 bar and then backwards with the same step width.

Additional embodiments and aspects are described which may be used alone or in combination with the features and functionalities described herein.

An embodiment comprises a method 100 for manufacturing a pressure sensitive transistor 10, the method comprising: forming no a channel region 22 between a first contact region 18 and a second contact region 20 in a semiconductor substrate 20, forming 120 a first isolation layer 24 on a main surface 12-A of the semiconductor substrate 12, forming 130 a sacrificial structure 26 on the first isolation layer 24 and above the channel region 22, forming 140 a semiconductor layer 30 on the sacrificial structure and on the first isolation layer 24, wherein the semiconductor layer 30 covers the sacrificial structure 26, removing 150 the sacrificial structure 26 for providing a cavity 34 between the substrate 12 and the semiconductor layer 30 wherein the semiconductor layer 30 forms a membrane structure having a displaceable center region 30-1 and forms a control electrode of the pressure sensitive transistor 10, forming 160 a second isolation layer 40 on the membrane structure 30, and forming 170 contacting structures 44-1, 50-1, 44-2, 50-2, 44-3, 50-3 for the first contact region 18, the second contact region 20 and the membrane structure 30 of the pressure sensitive transistor 10.

According to one aspect, the step 110 of forming a channel region 22 comprises: doping the semiconductor substrate 12 by ion implanting dopants of a first doping type in the semiconductor substrate 12 for providing a doped region 16 having a first doping concentration, and doping the semiconductor substrate 12 by ion implanting dopants of the second doping type in the semiconductor substrate 12 for providing the first contact region 18 and the second contact region 20 having a second doping concentration which is higher than the first doping concentration, wherein the first contact region 18 forms a drain region and the second contact region 20 forms a source region of the pressure sensitive transistor 10, and wherein the first contact region 18 and the second contact region 20 laterally confine the channel region 22 therebetween.

According to another aspect, the first isolation layer 24 is formed by depositing the first isolation layer 24 on the main surface 12-A of the semiconductor substrate 12, wherein the first isolation layer 24 forms a control electrode dielectric of the pressure sensitive transistor 10.

According to another aspect, the step 130 of forming the sacrificial structure 26 comprises: depositing a sacrificial layer 26' on the first isolation layer 24, and structuring the deposited sacrificial layer 26' to form the sacrificial structure 26 wherein the sacrificial structure 26 covers the channel region 22 and at least partially the first contact region 18 and the second contact region 20 in the semiconductor substrate 12.

According to another aspect, the deposited sacrificial layer 26' is structured to be symmetrically arranged over the channel region 22 and with respect to the first and second contact regions 18, 20 in the semiconductor substrate 12.

According to another aspect, the method 100 further comprises: forming a further isolation layer 28' on the sacrificial layer 26', so that the sacrificial layer 26' is sandwiched between the first isolation layer 24 and the further isolation layer 28', wherein the further isolation layer 28' is also structured during structuring the sacrificial layer 26', so that the sacrificial structure 26 is sandwiched between the first isolation layer 24 and the structured further isolation layer 28.

According to another aspect, the step 140 of forming a semiconductor layer 30 comprises: depositing an amorphous semiconductor material on the sacrificial structure 26, wherein the semiconductor layer 30 covers the sacrificial structure 26 and the first isolation layer 24, except for at least one release opening 32 to the sacrificial structure 26, and structuring the semiconductor layer 30' for providing structured semiconductor layer forming the membrane structure 30 adjacent to the cavity 34.

According to another aspect, the sacrificial structure 26 is removed through the at least one release opening 32 for providing the cavity 34 between the semiconductor substrate 12 and the structured semiconductor layer 30.

According to another aspect, the method 100 further comprises: annealing the structured semiconductor layer 30, wherein the structured semiconductor layer 30 comprises an amorphous silicon material, in order to recrystallize into polycrystalline silicon material.

According to another aspect, the step 160 of forming a second isolation layer 40 comprises: depositing the second isolation layer 40 with a CVD process or a HDP-CVD process on the membrane structure 30 for sealing the cavity under low pressure, wherein the low pressure in the cavity 34 corresponds to the process pressure of the CVD process or HPD-CVD process, so that the hermetically sealed cavity 34 is formed between the semiconductor substrate 12 and the opposing membrane structure 30, and planarizing the second isolation layer 40 by means of a CMP process (CMP=chemical mechanically polishing).

According to another aspect, the step 170 of forming contacting structures 44-1, 50-1, 44-2, 50-2, 44-3, 50-3 further comprises: etching a through hole or trench 42-1, 42-2, 42-3 in the second isolation layer 40 to the first contact region 18, to the second contact region 20 and to the membrane structure 30, and filing the through holes or trenches 42-1, 42-2, 42-3 with a conductive material 44 to form conductive vias 44-1, 44-2, 44-3 to the first contact region 18, to the second contact region 20 and to the membrane structure 30.

According to another aspect, the method 100 further comprises: depositing a metal layer 50 on the second isolation layer 40 and the conductive vias 44-1, 44-2, 44-3 formed therein and in electrical connection with the conductive material 44 in the vias, and structuring the metal layer 50 for providing isolated contact areas 50-1, 50-2, 50-3 for the first contact region 18 and the second contact region 20 in the semiconductor substrate 12 and for the membrane structure 30.

According to another aspect, the method 100 further comprises: depositing a passivation layer 60 for covering and protecting the structured metal layer 50 forming the separated contact areas 50-1, 50-2, 50-3.

According to another aspect, the passivation layer 60 comprises a plurality of different isolation layers 62, 64, e.g., a SiN/SiO stack.

According to another aspect, the method 100 further comprises: exposing the membrane structure 30 by removing the second isolation layer 40 and the passivation layer 60 on the membrane structure 30 so that the exposed membrane structure 30 is in a fluid communication with the environment, depositing a further passivation layer 66 on the exposed membrane structure 30 and the exposed portions of the second isolation layer 40 and the passivation layer 60, and exposing at least partially the contact areas 50-1, 50-2, 50-3 for the first contact region 18, the second contact region 20 and the control electrode 30 of the pressure sensitive transistor 10 by selectively removing the passivation layer 60 and the further passivation layer 66.

According to another aspect, the method 100 further comprises: providing the semiconductor substrate 12 having a STI structure 14, (STI=Shallow Trench Isolation) for defining a transistor process area in the semiconductor substrate 12 which is laterally confined by trenches 14-1, 14-2 in the semiconductor substrate 12 which are filled with an isolation material.

Another embodiment comprises a pressure sensitive field effect transistor 10 comprising: a semiconductor substrate 12 having a channel region 22 between a first contact region 18 and a second contact region 20, the channel region 22 comprises a first doping type with a first doping concentration, wherein the first and second contact areas 18, 20 comprise a second doping type with a second doping concentration which is higher than the first doping concentration, a first isolation layer 24, which forms a control electrode dielectric, is arranged on the semiconductor substrate 12 and covers the channel region 22 and at least partially covers the first and second contact regions 18, 20, a membrane structure 30, which is arranged on the control electrode dielectric 24 and provides a cavity 34 with the opposing semiconductor substrate 12, wherein the membrane structure 30 forms a control electrode of the pressure sensitive transistor 10 and has a center region 30-1 which is displaceable in response to a changed pressure difference ΔP between the environment and the inner volume of the sealed cavity 34, a second isolation layer 40, which is at least laterally arranged to the membrane structure 30 for hermetically sealing the cavity 34 between the membrane structure 30 and the semiconductor substrate 12, and contact pads 50-1, 50-2, 50-3, which are connected to the first contact region 18, the second contact region 20, and the membrane structure 30, respectively.

Although some aspects have been described as features in the context of an apparatus it is clear that such a description may also be regarded as a description of corresponding features of a method. Although some aspects have been described as features in the context of a method, it is clear that such a description may also be regarded as a description of corresponding features concerning the functionality of an apparatus.

In the foregoing Detailed Description, it can be seen that various features are grouped together in examples for the purpose of streamlining the disclosure. This method of disclosure is not to be interpreted as reflecting an intention that the claimed examples require more features than are expressly recited in each claim. Rather, as the following claims reflect, subject matter may lie in less than all features of a single disclosed example. Thus the following claims are hereby incorporated into the Detailed Description, where each claim may stand on its own as a separate example. While each claim may stand on its own as a separate example, it is to be noted that, although a dependent claim may refer in the claims to a specific combination with one or more other claims, other examples may also include a combination of the dependent claim with the subject matter of each other dependent claim or a combination of each feature with other dependent or independent claims. Such combinations are proposed herein unless it is stated that a specific combination is not intended. Furthermore, it is intended to include also features of a claim to any other independent claim even if this claim is not directly made dependent to the independent claim.

Although specific embodiments have been illustrated and described herein, it will be appreciated by those of ordinary skill in the art that a variety of alternate and/or equivalent implementations may be substituted for the specific embodiments shown and described without departing from the scope of the present embodiments. This application is intended to cover any adaptations or variations of the specific embodiments discussed herein. Therefore, it is intended that the embodiments be limited only by the claims and the equivalents thereof.

What is claimed is:

1. A method for manufacturing a pressure sensitive transistor, the method comprising:
   forming a channel region between a first contact region and a second contact region in a semiconductor substrate;
   forming a first isolation layer on a main surface of the semiconductor substrate;
   forming a sacrificial structure on the first isolation layer and above the channel region;
   forming a semiconductor layer on the sacrificial structure and on the first isolation layer, wherein the semiconductor layer covers the sacrificial structure;
   forming a further isolation layer on the sacrificial structure;
   removing the sacrificial structure without removing the first isolation layer and without removing the further isolation layer, for providing a cavity between the substrate and the semiconductor layer wherein the semiconductor layer forms a membrane structure having a displaceable center region and forms a control electrode of the pressure sensitive transistor;
   forming a second isolation layer on the membrane structure; and
   forming contacting structures for the first contact region, the second contact region and the membrane structure of the pressure sensitive transistor,
   wherein the first isolation layer and the further isolation layer remain in a final version of the pressure sensitive transistor.

2. The method of claim 1, wherein the step of forming a channel region comprises:
   doping the semiconductor substrate by ion implanting dopants of a first doping type in the semiconductor substrate for providing a doped region having a first doping concentration; and
   doping the semiconductor substrate by ion implanting dopants of a second doping type in the semiconductor substrate for providing the first contact region and the second contact region having a second doping concentration which is higher than the first doping concentration,
   wherein the first contact region forms a drain region and the second contact region forms a source region of the pressure sensitive transistor, and wherein the first contact region and the second contact region laterally confine the channel region therebetween.

3. The method of claim 1, wherein the first isolation layer is formed by depositing the first isolation layer on the main surface of the semiconductor substrate, wherein the first isolation layer forms a control electrode dielectric of the pressure sensitive transistor.

4. The method of claim 1, wherein the step of forming the sacrificial structure comprises:
   depositing a sacrificial layer on the first isolation layer; and
   structuring the deposited sacrificial layer to form the sacrificial structure wherein the sacrificial structure covers the channel region and at least partially the first contact region and the second contact region in the semiconductor substrate.

5. The method of claim 4, wherein the deposited sacrificial layer is structured to be symmetrically arranged over the channel region and with respect to the first and second contact regions in the semiconductor substrate.

6. The method of claim 4, further comprising:
   forming the further isolation layer on the sacrificial layer, so that the sacrificial layer is sandwiched directly between the first isolation layer and the further isolation layer,
   wherein the further isolation layer is also structured during structuring the sacrificial layer, so that the sacrificial structure is sandwiched between the first isolation layer and the structured further isolation layer.

7. The method of claim 1, wherein the step of forming a semiconductor layer comprises:
   depositing an amorphous semiconductor material on the sacrificial structure, wherein the semiconductor layer covers the sacrificial structure and the first isolation layer, except for at least one release opening to the sacrificial structure; and
   structuring the semiconductor layer for providing a structured semiconductor layer forming the membrane structure adjacent to the cavity.

8. The method of claim 7, wherein the sacrificial structure is removed through the at least one release opening for providing the cavity between the semiconductor substrate and the structured semiconductor layer.

9. The method of claim 7, further comprising:
   annealing the structured semiconductor layer, wherein the structured semiconductor layer comprises an amorphous silicon material, in order to recrystallize into polycrystalline silicon material.

10. The method of claim 1, wherein the step of forming a second isolation layer comprises:
    depositing the second isolation layer with a CVD process or a HDP-CVD process on the membrane structure for sealing the cavity under low pressure, wherein the low pressure in the cavity corresponds to a process pressure of the CVD process or HPD-CVD process, so that a hermetically sealed cavity is formed between the semiconductor substrate and an opposing membrane structure; and
    planarizing the second isolation layer by a chemical mechanical polishing (CMP) process.

11. The method of claim 1, wherein the step of forming contacting structures further comprises:
    etching a through hole or trench in the second isolation layer to the first contact region, to the second contact region and to the membrane structure; and
    filing the through holes or trenches with a conductive material to form conductive vias to the first contact region, to the second contact region and to the membrane structure.

12. The method of claim 11, further comprising:
    depositing a metal layer on the second isolation layer and the conductive vias formed therein and in electrical connection with the conductive material in the vias; and
    structuring the metal layer for providing isolated contact areas for the first contact region and the second contact region in the semiconductor substrate and for the membrane structure.

13. The method of claim 12, further comprising:
    depositing a passivation layer for covering and protecting the structured metal layer forming the isolated contact areas.

14. The method of claim 13, wherein the passivation layer comprises a plurality of different isolation layers.

15. The method of claim 1, further comprising:
    exposing the membrane structure by removing the second isolation layer and a passivation layer on the membrane structure so that the exposed membrane structure is in a fluid communication with an environment;

depositing a further passivation layer on the exposed membrane structure and exposed portions of the second isolation layer and a passivation layer; and exposing at least partially contact areas for the first contact region, the second contact region and the control electrode of the pressure sensitive transistor by selectively removing the passivation layer and the further passivation layer.

16. The method of claim 1, further comprising:

providing the semiconductor substrate having a STI structure for defining a transistor process area in the semiconductor substrate which is laterally confined by trenches in the semiconductor substrate which are filled with an isolation material.

17. The method for claim 1, wherein the first isolation layer defines a planar lower boundary of the cavity.

18. The method for claim 1, wherein the further isolation layer defines a planar upper boundary of the cavity.

19. The method of claim 1, wherein a width of the first isolation is greater than a width of the cavity, and a width of the further isolation layer is the same as the width of the cavity.

20. A method for manufacturing a pressure sensitive transistor, the method comprising:

forming a channel region between a first contact region and a second contact region in a semiconductor substrate;

forming a first isolation layer on a main surface of the semiconductor substrate;

forming a sacrificial structure on the first isolation layer and above the channel region;

forming a semiconductor layer on the sacrificial structure and on the first isolation layer, wherein the semiconductor layer covers the sacrificial structure;

forming a further isolation layer on the sacrificial structure;

removing the sacrificial structure without removing the first isolation layer and without removing the further isolation layer, for providing a cavity between the substrate and the semiconductor layer wherein the semiconductor layer forms a membrane structure having a displaceable center region and forms a control electrode of the pressure sensitive transistor;

forming a second isolation layer on the membrane structure; and forming contacting structures for the first contact region, the second contact region and the membrane structure of the pressure sensitive transistor, wherein the further isolation layer defines a planar upper boundary of the cavity.

21. A method for manufacturing a pressure sensitive transistor, the method comprising:

forming a channel region between a first contact region and a second contact region in a semiconductor substrate;

forming a first isolation layer on a main surface of the semiconductor substrate;

forming a sacrificial structure on the first isolation layer and above the channel region;

forming a semiconductor layer on the sacrificial structure and on the first isolation layer, wherein the semiconductor layer covers the sacrificial structure;

forming a further isolation layer on the sacrificial structure;

removing the sacrificial structure without removing the first isolation layer and without removing the further isolation layer, for providing a cavity between the substrate and the semiconductor layer wherein the semiconductor layer forms a membrane structure having a displaceable center region and forms a control electrode of the pressure sensitive transistor;

forming a second isolation layer on the membrane structure; and forming contacting structures for the first contact region, the second contact region and the membrane structure of the pressure sensitive transistor, wherein a width of the first isolation layer is greater than a width of the cavity, and a width of the further isolation layer is the same as the width of the cavity.

* * * * *